(12) United States Patent
Wai et al.

(10) Patent No.: US 7,423,345 B2
(45) Date of Patent: Sep. 9, 2008

(54) SEMICONDUCTOR CONSTRUCTIONS COMPRISING A LAYER OF METAL OVER A SUBSTRATE

(75) Inventors: Chien M. Wai, Moscow, ID (US); Hiroyuki Ohde, Moscow, ID (US); Steve Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 10/280,546

(22) Filed: Oct. 25, 2002

(65) Prior Publication Data
US 2008/0136028 A1 Jun. 12, 2008

Related U.S. Application Data

(62) Division of application No. 10/112,122, filed on Mar. 29, 2002, now Pat. No. 6,653,236.

(51) Int. Cl.
*H01L 21/00* (2006.01)
(52) U.S. Cl. .................................. 257/758; 257/751
(58) Field of Classification Search ................ 438/166, 438/687, 688, 689, 690, 685, 686, 396; 428/457; 257/750–765
See application file for complete search history.

(56) References Cited

U.S. PATENT DOCUMENTS

| | | | |
|---|---|---|---|
| 4,552,786 A | 11/1985 | Berneburg et al. | |
| 4,582,731 A | 4/1986 | Smith | |
| 4,692,349 A | 9/1987 | Georgiou et al. | |
| 4,734,227 A | 3/1988 | Smith | |
| 4,737,384 A | 4/1988 | Murthy et al. | |
| 4,847,674 A * | 7/1989 | Sliwa et al. ................. | 257/767 |
| 4,970,093 A | 11/1990 | Sievers et al. | |
| 5,227,149 A | 7/1993 | Sullivan | |
| 5,403,621 A | 4/1995 | Jackson et al. | |
| 5,403,772 A * | 4/1995 | Zhang et al. ................. | 438/166 |
| 5,462,014 A | 10/1995 | Awaya et al. | |
| 5,470,802 A | 11/1995 | Gnade et al. | |

(Continued)

FOREIGN PATENT DOCUMENTS

EP  0 881673 A2  12/1998

(Continued)

OTHER PUBLICATIONS

Blackburn, Jason M. et al., "Deposition of Conformal Copper and Nickel Films from Supercritical Carbon Dioxide", Science, vol. 294, Oct. 5, 2001, pp. 141-145.

(Continued)

*Primary Examiner*—Laura M Schillinger
(74) *Attorney, Agent, or Firm*—Wells St. John P.S.

(57) ABSTRACT

The invention includes a method of forming a metal-containing film over a surface of a semiconductor substrate. The surface is exposed to a supercritical fluid. The supercritical fluid has $H_2$, at least one $H_2$-activating catalyst, and at least one metal-containing precursor dispersed therein. A metal-containing film is formed across the surface of the semiconductor substrate from metal of the at least one metal-containing precursor. The invention also includes semiconductor constructions having metal-containing layers which include one or more of copper, cobalt, gold and nickel in combination with one or more of palladium, platinum, iridium, rhodium and ruthenium.

19 Claims, 3 Drawing Sheets

U.S. PATENT DOCUMENTS

| | | | |
|---|---|---|---|
| 5,489,548 A * | 2/1996 | Nishioka et al. | 438/396 |
| 5,514,477 A * | 5/1996 | Ohashi et al. | 428/457 |
| 5,554,564 A * | 9/1996 | Nishioka et al. | 438/396 |
| 5,563,426 A * | 10/1996 | Zhang et al. | 257/66 |
| 5,789,027 A | 8/1998 | Watkins et al. | |
| 5,891,513 A | 4/1999 | Dubin et al. | |
| 5,982,629 A * | 11/1999 | Shoji et al. | 361/760 |
| 6,181,012 B1 * | 1/2001 | Edelstein et al. | 257/762 |
| 6,348,732 B1 * | 2/2002 | Lopatin et al. | 257/751 |
| 6,352,920 B1 * | 3/2002 | Shimomura | 438/637 |
| 6,358,848 B1 * | 3/2002 | Lopatin | 438/687 |
| 6,365,502 B1 * | 4/2002 | Paranjpe et al. | 438/622 |
| 6,365,511 B1 * | 4/2002 | Kizilyalli et al. | 438/649 |
| 6,387,806 B1 * | 5/2002 | Wang et al. | 438/687 |
| 6,399,496 B1 * | 6/2002 | Edelstein et al. | 438/687 |
| 6,624,513 B1 * | 9/2003 | Iwasaki et al. | 257/753 |
| 6,635,528 B2 * | 10/2003 | Gilbert et al. | 438/253 |
| 6,653,236 B2 * | 11/2003 | Wai et al. | 438/687 |
| 6,689,700 B1 | 2/2004 | Watkins et al. | |
| 7,119,018 B2 * | 10/2006 | Lane et al. | 438/686 |
| 2006/0006070 A1 * | 1/2006 | Lane et al. | 205/74 |
| 2006/0157857 A1 * | 7/2006 | Lane et al. | 257/758 |

FOREIGN PATENT DOCUMENTS

| | | |
|---|---|---|
| EP | 0 881673 A3 | 12/1998 |
| WO | 00/30264 | 11/2000 |

OTHER PUBLICATIONS

Long, David P. et al., "Chemical Fluid Deposition: A Hybrid Technique for Low-Temperature Metallization", Adv. Materials, vol. 12, No. 12, 2000, pp. 913-915.

Hybertson, B. et al., "Deposition of Palladium Films by a Novel Supercritical Fluid Transport-Chemical Deposition Process", Mat. Res. Bull. vol. 26 (1991), pp. 1127-1133.

Hansen, B. et al., "Supercritical Fluid Transport-Chemical Deposition of Films", Chem. Mater. vol. 4 (1992), pp. 749-752.

Bocquet, J. et al., "A New $TiO_2$ Film Deposition Process in a Supercritical Fluid", Surface and Coatings Tech. vol. 70 (1994 Elsevier), pp. 73-78.

Hampden-Smith, M. et al., "Chemical Vapor Deposition of Metals: Part 1. An Overview of CVD Processes", Chem. Vap. Deposit. vol. 1 (1995), pp. 8-23.

Louchev, O. et al., "The Morphological Stability in Supercritical Fluid Chemical Deposition of Films Near the Critical Point", Journ. of Crystal Growth vol. 155 (1995 Elsevier), pp. 276-285.

Watkins, J. et al., "Polymer/Metal Nanocomposite Synthesis in Supercritical $CO_2$", Chemistry of Materials vol. 7, No. 11 (1995), pp. 1991-1994.

* cited by examiner

SEMICONDUCTOR CONSTRUCTIONS COMPRISING A LAYER OF METAL OVER A SUBSTRATE

RELATED PATENT DATA

This patent resulted from a divisional application of U.S. patent application Ser. No. 10/112,122, which was filed on Mar. 29, 2002 now U.S. Pat. No. 6,653,236.

TECHNICAL FIELD

The invention pertains to methods of forming metal-containing films over surfaces of semiconductor substrates. In particular applications, the invention pertains to methods of forming copper-containing films. The copper-containing films can be formed on dielectric materials (such as, for example, silicon dioxide or low-k dielectric materials) or on barrier layers comprising one or more of titanium, tantalum, tungsten and molybdenum; including barrier layers comprising nitride compositions of one or more of titanium, tantalum, tungsten and molybdenum, and barrier layers comprising silicides of one or more of titanium, chromium and cobalt. The invention also pertains to semiconductor constructions. Additionally, the invention pertains to deposition of materials in nanostructures with high aspect ratios on substrates.

BACKGROUND OF THE INVENTION

It is frequently desired to form metal-containing materials over semiconductor substrates. The metal-containing materials can be incorporated into integrated circuit devices, and/or can be utilized for formation of conductive interconnects between integrated circuit devices.

Copper is a commonly-used conductive material, and is frequently formed over semiconductor substrates for utilization in conductive interconnects. A difficulty in utilizing copper in semiconductor fabrication is that diffusion can occur between copper and various semiconductive materials, including, for example, silicon. Accordingly, barrier layers are often utilized to separate copper from semiconductive materials. Typical barrier layers can include one or more of tungsten, tantalum and titanium. Suitable materials for the barrier layers include, for example, tungsten nitride, tantalum nitride, and/or titanium nitride. Additionally, or alternatively, barrier layers can comprise silicides such as, for example, $TiSi_2$, $CoSi_2$, and chromium silicide.

Although the barrier layers can alleviate or prevent the problem of diffusion between copper and semiconductive materials, the utilization of barrier layers can create new difficulties in semiconductor device fabrication. For instance, it can be difficult to adhere copper to barrier layers.

It is noted that semiconductor processing can comprise formation of metal-containing materials directly on various surfaces without utilizing a barrier layer between the surfaces and the metal-containing materials. For instance, if the metals of the metal-containing materials are so-called noble metals (such as rhodium and iridium, for example), the metal-containing materials can frequently be utilized without barrier layers. Also, if metal-containing materials are deposited on surfaces from which diffusion is unlikely (such as, for example, surfaces comprising Pt or $RuO_2$), barrier layers can be omitted.

It can be desired to incorporate one or more of various metals (such as, for example, copper, platinum, tungsten, rhodium, ruthenium, iridium, gold and nickel) into semiconductor devices. Incorporation of any of the various metals into semiconductor devices can be difficult. It would therefore be desirable to develop new methods for incorporating metal-containing materials into semiconductor constructions.

SUMMARY OF THE INVENTION

In one aspect, the invention encompasses a method of forming a metal-containing film over a surface of a semiconductor substrate. The surface is exposed to a supercritical fluid. The supercritical fluid has $H_2$, at least one $H_2$-activating catalyst, and at least one metal-containing precursor dispersed therein. A metal-containing film is formed across the surface of the semiconductor substrate from metal of the at least one metal-containing precursor.

In one aspect, the invention encompasses a method of forming a metal-containing film over a surface of a semiconductor substrate wherein the surface is exposed to a supercritical fluid having $H_2$, at least one $H_2$-activating catalyst, and at least one metal-containing precursor dispersed therein. The metal-containing film has from greater than 0 atom % to less than or equal to 5 atom % of the catalyst incorporated therein together with metal from the metal-containing precursor.

In one aspect, the invention encompasses a method wherein a copper-containing film is formed over and physically against a barrier layer comprising one or more of tungsten, tantalum, cobalt, chromium and titanium, such as, for example, a layer comprising nitrides and/or silicides of one or more of tungsten, tantalum, cobalt, chromium and titanium. The film is formed by exposing a surface of the barrier layer to a supercritical fluid having a copper-containing precursor, a palladium catalyst, and $H_2$ dispersed therein. The film consists essentially of copper and palladium, with the palladium being present to a concentration of greater than zero atom percent and less than 5 atom percent, such as, for example, less than 0.2 atom percent.

In one aspect, the invention encompasses a semiconductor construction having a layer of metal across a surface of a semiconductor substrate. The layer consists essentially of a first metal and a second metal. The first metal is selected from the group consisting of Al, Au, Co, Cr, Cu, Hf, In, Ir, Mo, Ni, Rh, Ru, Sn, Ta, Ti, W, Zr and mixtures thereof; and the second metal is selected from the group consisting of palladium, platinum, rhodium, iridium, ruthenium and mixtures thereof. The second metal is different than the first metal, and the layer comprises at least 95 atom percent of the first metal.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
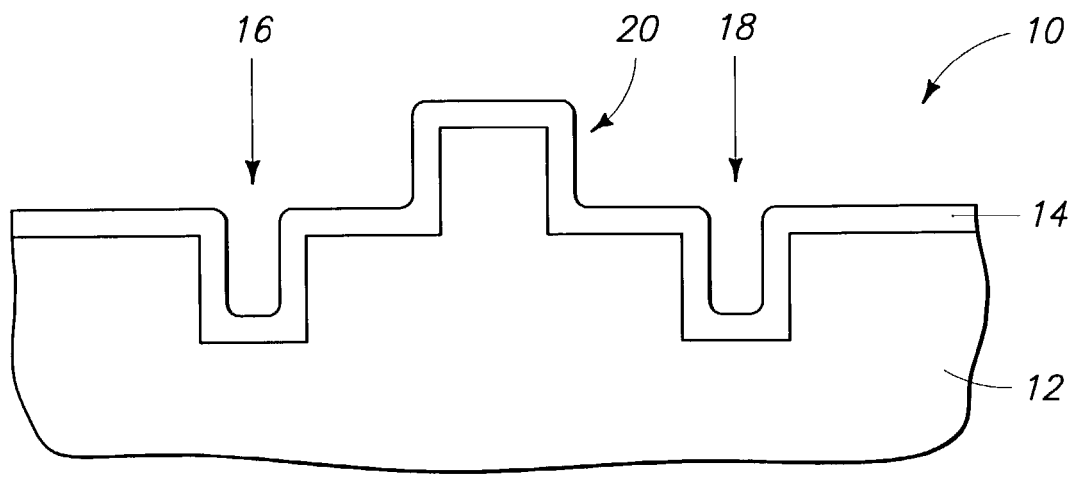
FIG. 1 is a diagrammatic, cross-sectional view of a semiconductor wafer fragment at a preliminary processing stage of a method of the present invention.

In particular applications, the invention encompasses processes of forming metal-containing films over semiconductor substrates. The metal-containing films can comprise, consist essentially of, or consist of, for example, one or more of Al, Au, Co, Cr, Cu, Hf, In, Ir, Mo, Ni, Rh, Ru, Sn, Ta, Ti, W and Zr.

The processing can include exposing a surface of the semiconductor substrate to a supercritical fluid. As is known to persons of ordinary skill in the art, a supercritical fluid is defined as any substance that is above its critical temperature ($T_c$) and critical pressure ($P_c$). $T_c$ is the highest temperature at which a gas can be converted to a liquid by an increase in pressure, and $P_c$ is the highest pressure at which a liquid can be converted to a traditional gas by an increase in the liquid temperature. In the so-called critical region there is only one phase, and it possesses properties of both gas and liquid. Supercritical fluids differ from traditional liquids in several aspects. For example, the solvent power of a supercritical fluid will typically increase with density at a given temperature. The utilization of supercritical fluid can reduce a temperature at which metals are deposited relative to other methods, and yet can enhance a deposition rate of the metals. Additionally, deposition from within a supercritical fluid can allow for infiltration of very small, high aspect ratio features. This may be due to negligible surface tension during deposition and very high diffusivity. Due to it's ability to fill high aspect ratio features, deposition from within a supercritical fluid can be used to fill sub-micron nano-features.

In particular applications of the present invention, the supercritical fluid can have $H_2$, at least one $H_2$-activating catalyst, and at least metal-containing precursor dispersed and/or dissolved therein. For purposes of interpreting this disclosure and the claims that follow, the term "supercritical fluid" is utilized to refer specifically to a portion of a composition that is in a supercritical state (i.e., is utilized to refer to the supercritical component of a composition). Typically, the materials dispersed and/or dissolved within the supercritical fluid will not be in a supercritical state, and accordingly will not be part of the supercritical fluid. However, it is noted that in particular applications one or more of the materials dispersed within a supercritical fluid can, themselves, be in a supercritical state. In such applications, the dispersed materials that are in the supercritical state will be part of the supercritical fluid.

The supercritical fluid can, in particular aspects of the invention, comprise, consist essentially of, or consist of one or more of $CO_2$, ammonia, and an alkanol having from one to five carbon atoms. Exemplary alkanols are ethanol and methanol. Other exemplary materials that can be formed into supercritical fluids are isooctane, hexane, heptane, butane, methane, ethane, propane, ethene, propene, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, and dimethylether.

In particular applications the supercritical fluid can comprise, consist essentially of, or consist of $CO_2$, and can have various components, including, for example, an $H_2$-activating catalyst dissolved therein. An advantage of utilizing $CO_2$, as opposed to other supercritical fluids, is that $CO_2$ has a relatively low critical temperature of 304.13K, (31° C.).

The metal-containing precursor utilized in particular aspects of the present invention comprises a metal (such as, for example, Al, Au, Co, Cr, Cu, Hf, In, Ir, Mo, Ni, Rh, Ru, Sn, Ta, Ti, W and/or Zr) in combination with a chemical group (which can be referred to as a ligand) which enhances solubility of the metal in the supercritical fluid. Suitable ligands include β-diketones of the general formula $R_1C(O)CH_2C(O)R_2$, in which $R_1$ and $R_2$ can be fluorinated or non-fluorinated alkyl groups. Exemplary β-diketones are acetylacetone, trifluoroacetylacetone, hexafluoroacetylacetone, thenoyltrifluoroacetone, and heptafluorobutanoylpivaroylmethane. Other suitable ligands include 6,6,7,7,8,8,8-heptafluoro-2,2-dimethyl-3,5-octadionate and tris(2,2,6,6-tetramethyl-3,5-heptanedionate).

In exemplary applications in which the supercritical fluid comprises $CO_2$, the chemical group utilized to enhance solubility of a metal within the fluid can comprise a fluorocarbon, with an exemplary group being hexafluoroacetylacetone. Accordingly, an exemplary copper-containing precursor is copper(II) hexafluoroacetylacetonate ($Cu(hfa)_2$). Additionally, or alternatively, the metal-containing precursor can comprise one or more of cobalt(II) hexafluoroacetylacetonate, nickel(II) hexafluoroacetylacetonate, and gold(II) hexafluoroacetylacetonate.

The $H_2$-activating catalyst is a material which can react with $H_2$ to form at least one activated hydrogen species. The catalyst can include, for example, so-called noble metal catalysts, and can, in particular applications, include at least one of palladium, platinum, rhodium, iridium and ruthenium. In particular applications, the catalyst can comprise, consist essentially of, or consist of one or more of palladium, platinum, titanium, tin and ruthenium. For instance, only one catalyst can be provided, and such catalyst can be palladium.

The catalyst can be provided within the supercritical fluid in combination with a group which enhances solubility of the catalyst in the supercritical fluid. For example, the catalyst can be provided in combination with the hexafluoroacetylacetone group. In an exemplary application, palladium can be provided as palladium(II) hexafluoroacetylacetonate. A possible mechanism by which the palladium can enhance deposition of copper, or other metals, is as follows. The palladium ion can be reduced to metal palladium by hydrogen. Elemental palladium from this reaction can deposit on a surface and subsequently catalyze a surface reaction in which Cu and/or other metals substitute for Pd at the surface. Additionally, or alternatively, Pd may function as a "seed" layer for subsequent deposition of Cu and/or other metals. The mechanisms are provided to assist the reader in understanding the invention. The invention is not limited to any particular mechanisms provided herein, except to the extent, if any, that particular mechanisms are recited in the claims which follow.

A general mechanism which can operate in various aspects of the invention is that the catalyst can activate $H_2$ to form a hydrogen species which then reacts with the metal-containing precursor to release metal. The released metal can form a film across a surface of a semiconductor substrate. For instance, if the metal-containing precursor comprises copper (II) complexes of $Cu(hfa)_2$, an exemplary reduction is as follows:

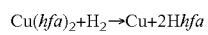

$$Cu(hfa)_2 + H_2 \rightarrow Cu + 2Hhfa$$

An advantage of the utilization of catalyst to form activated hydrogen is that such can reduce a temperature utilized for the reduction of metal-containing precursor. For instance, if a precursor comprises $Cu(hfa)_2$, and if no catalyst is present, the precursor would typically be reduced at a temperature in excess of 200° C. in supercritical $CO_2$. In contrast, if a palladium catalyst is present during reduction of the copper-containing precursor, the temperature of the supercritical fluid can be lowered to less than 200° C., less than 150° C., less than 125° C., or even less than 90° C. during reduction of the precursor to liberate copper. Such reduction in temperature can be particularly useful during treatment of semiconductor substrates, as such can reduce the thermal load that the substrate is exposed to. Specifically, a substrate, and particularly a surface of the substrate, can be maintained at a temperature of less than about 200° C., less than 150° C., or even less than 125° C. during exposure of the surface to a supercritical fluid in particular aspects of the present invention. The surface will typically be maintained at temperature of at least 85° C., however.

An exemplary application of the invention is described with reference to FIGS. 1 and 2. Referring to FIG. 1, a fragment of a semiconductor construction 10 is illustrated. Construction 10 can be considered to be a semiconductor substrate, and comprises a supporting mass 12 having a barrier layer 14 thereover. Supporting mass 12 can comprise a semiconductive material, such as, for example, silicon. Additionally, mass 12 can comprise various insulative materials over the silicon, including, for example, silicon nitride or BPSG. Further, mass 12 can comprise various integrated circuit constructions (not shown).

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Barrier layer 14 can comprise, for example, one or more of cobalt, chromium, tungsten, tantalum and titanium; and in particular applications can comprise one or more of cobalt silicide, chromium silicide, titanium silicide, tungsten nitride, titanium nitride and tantalum nitride.

Construction 10 has a number of surface features, including openings 16 and 18 extending into mass 12, and a projection 20 extending upwardly from mass 12.

Figure 2:
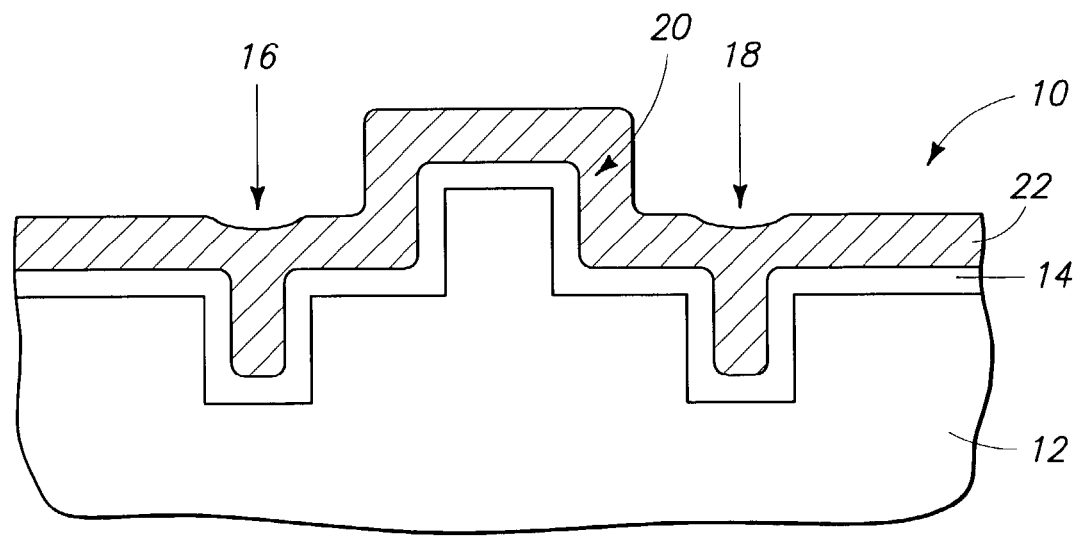
FIG. 2 is a view of the FIG. 1 wafer fragment shown at a processing stage subsequent to that of FIG. 1.

Referring to FIG. 2, a metal-containing layer 22 is formed over at least a portion of barrier layer 14, and in particular applications is formed across an entirety of an upper surface of a semiconductor substrate comprising barrier layer 14. The metal-containing layer 22 extends to within openings 16 and 18, and further extends conformally over projection 20. Metal-containing layer 22 can have a thickness of from greater than 0 Angstroms to at least about 20,000 Angstroms, and in particular applications will have a thickness of from about 10 Angstroms to about 5,000 Angstroms. In particular aspects of the invention, the metal-containing layer 22 can be formed to extend across fine structures, and conformally into high aspect ratio openings, (with "high aspect ratio" openings being understood to be openings having an aspect ratio of at least 4).

In accordance with particular aspects of the present invention, metal-containing layer 22 can be formed by exposing a surface of construction 10 (specifically, a surface of barrier layer 14 in the shown embodiment) to a supercritical fluid having $H_2$, at least one $H_2$-activating catalyst, and at least metal-containing precursor dispersed therein. Metal-containing layer 22 comprises metal from the metal-containing precursor, and in exemplary applications comprises one or more of Al, Au, Co, Cr, Cu, Hf, In, Ir, Mo, Ni, Rh, Ru, Sn, Ta, Ti, W and Zr. Layer 22 can further comprise some of the catalyst, and accordingly can comprise one or more of palladium, platinum, rhodium, ruthenium and iridium. Typically, the catalyst will be present in the metal-containing layer to a concentration of less than 5 atom percent, and more typically will be present to a concentration of from greater than 0 atom percent to less than about 3 atom percent, or even less than about 0.5 atom percent.

In applications in which the catalyst comprises palladium and the metal-containing precursor comprises one or more of Al, Au, Co, Cr, Cu, Hf, In, Ir, Mo, Ni, Rh, Ru, Sn, Ta, Ti, W and Zr; the metal-containing layer 22 can consist essentially of palladium and one or more of Al, Au, Co, Cr, Cu, Hf, In, Ir, Mo, Ni, Rh, Ru, Sn, Ta, Ti, W and Zr. In particular applications, the layer 22 will consist essentially of palladium and one or more of Al, Au, Co, Cr, Cu, Hf, In, Ir, Mo, Ni, Rh, Ru, Sn, Ta, Ti, W and Zr; with the total concentration of Al, Au, Co, Cr, Cu, Hf, In, Ir, Mo, Ni, Rh, Ru, Sn, Ta, Ti, W and Zr being at least 95 atom percent within layer 22. The layer 22 can, in particular applications, be considered a solid solution of one or more noble metal catalysts, and one or more of Al, Au, Co, Cr, Cu, Hf, In, Ir, Mo, Ni, Rh, Ru, Sn, Ta, Ti, W and Zr.

An advantage of having a small amount of a catalyst metal incorporated into metal layer 22 is that such can enhance adhesion of other metals within the layer to barrier layer 14. For instance, there are frequently problems encountered in the prior art for adhering copper to barrier layers, in that copper does not bind well to tantalum, titanium or tungsten. A possible mechanism by which the palladium can enhance adhesion of copper to barrier layer 14 is that the palladium is first deposited from the supercritical fluid onto layer 14 to form a thin surface film of palladium on the layer, and subsequently copper is deposited from the supercritical fluid onto the palladium film. The palladium can adhere well to an underlying barrier layer, and specifically can adhere well to one or more of cobalt, chromium, tantalum, titanium and tungsten; and copper can adhere well to the palladium. The mechanism is provided herein to assist a reader in understanding various aspects of the present invention, and is not intended to in any way limit the claims of this application except to the extent, if any, that the mechanism is expressly recited in the claims.

Although the applications of FIGS. 1 and 2 are described with reference to formation of a metal layer physically against and across a barrier layer 14, it is to be understood that the invention encompasses other applications. For instance, the metal layer can be formed directly on a semiconductive material, such as, for example, silicon. Alternatively, the metal layer can be formed on a seed layer. For instance, a copper-seed layer can be formed over a barrier layer or other substrate, and subsequently a copper-containing metal layer can be formed on the copper seed layer. In yet other applications, the metal layer 22 can be formed on an electrically insulative material, such as, for example, silicon dioxide, silicon nitride; a so-called high-k material, such as, for example, $Ta_2O_5$; or a so-called low-k material, such as, for example, SiOF. Alternatively, layer 22 can be formed on a metal, such as, for example, Pt or Ni.

Figure 3:
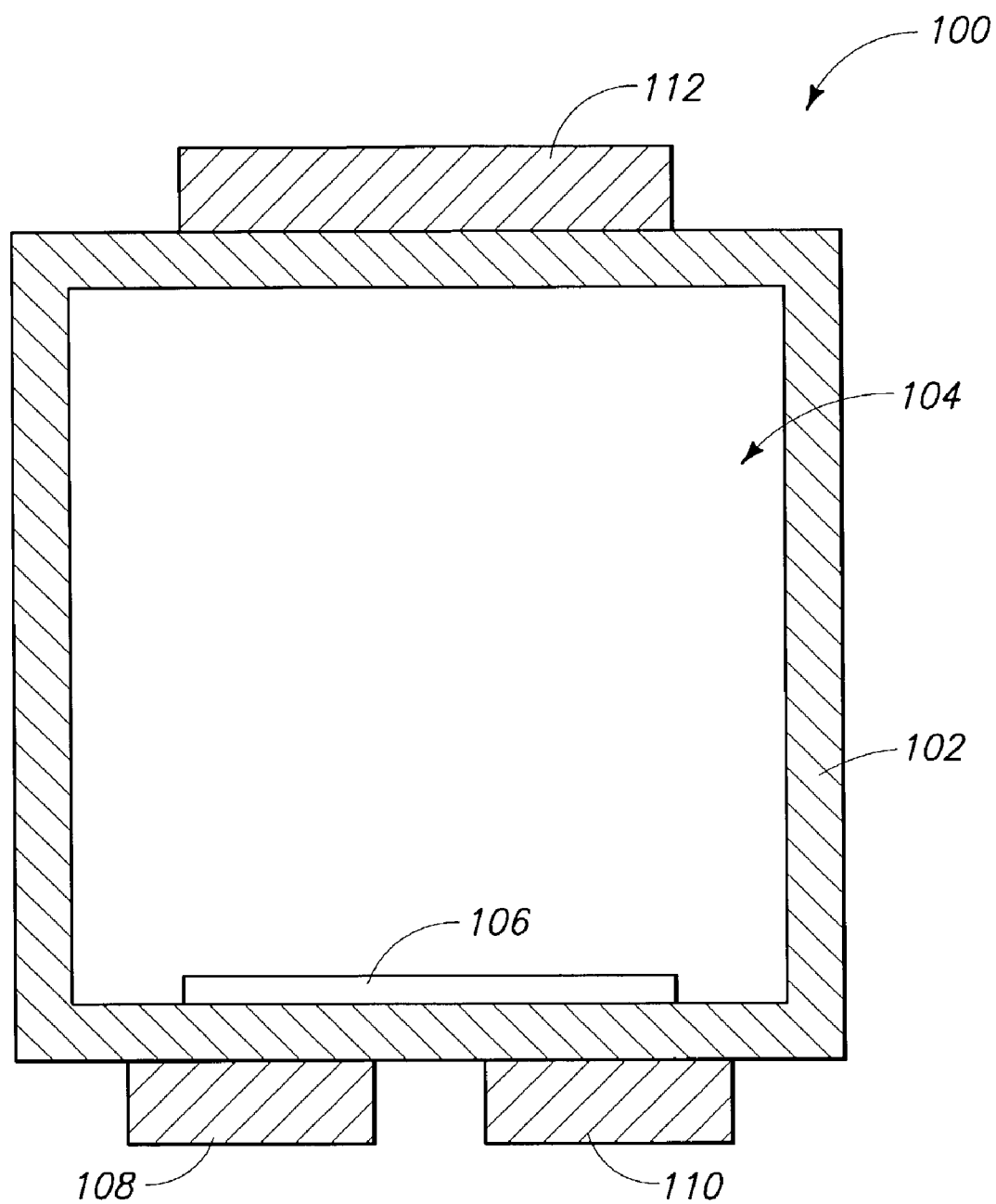
FIG. 3 is a diagrammatic, cross-sectional view of an exemplary apparatus which can be utilized in methodology of the present invention for forming metal-containing films over semiconductor substrates.
Figure 4:
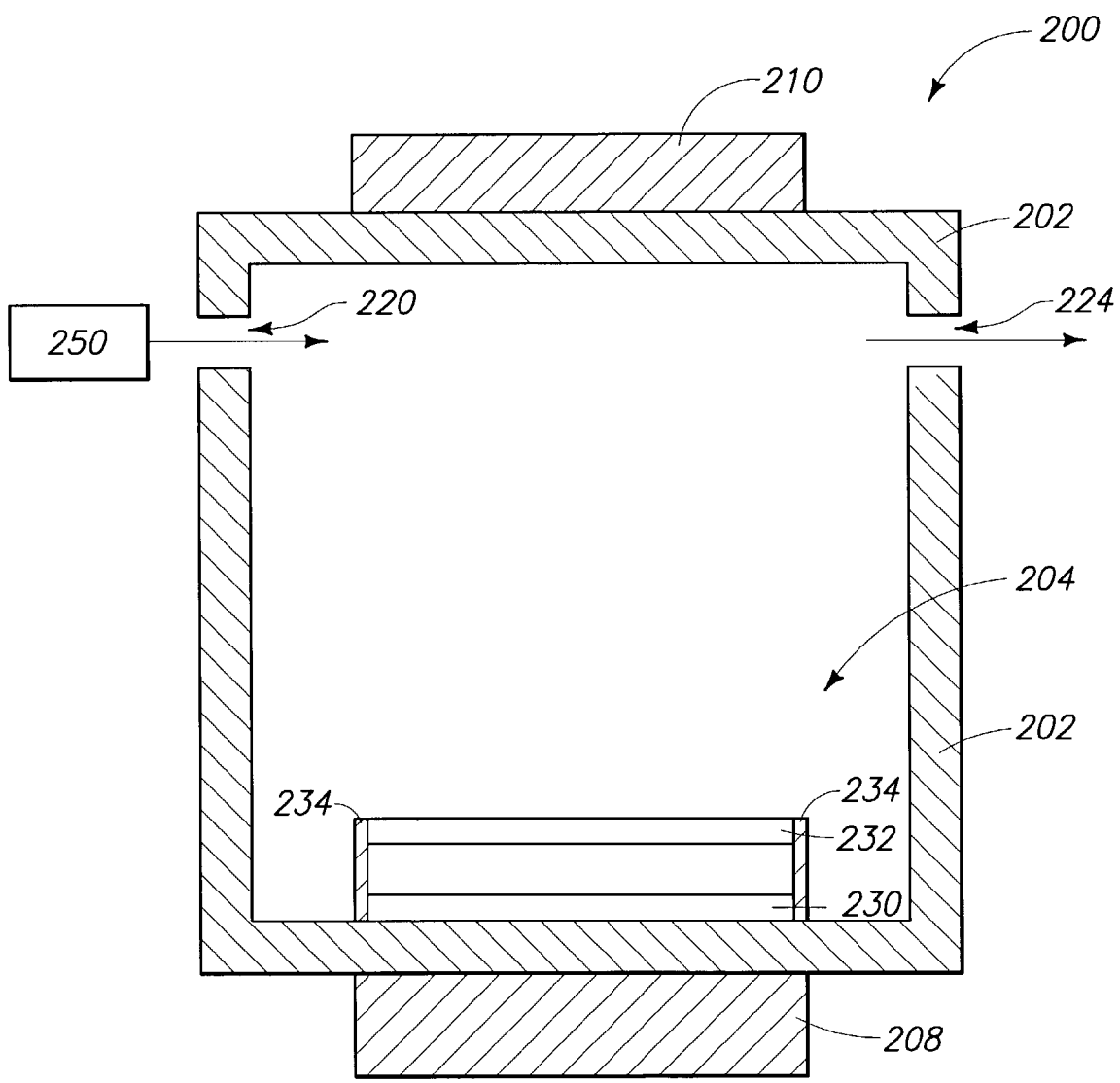
FIG. 4 is a diagrammatic, cross-sectional view of a second exemplary apparatus which can be utilized in methodology of the present invention for forming metal-containing films over semiconductor substrates.

FIGS. 3 and 4 illustrate exemplary apparatuses which can be utilized in particular aspects of the invention.

Referring initially to FIG. 3, an apparatus 100 is illustrated. Apparatus 100 comprises a vessel 102 having a reaction chamber 104 defined therein. A semiconductor substrate 106 is shown supported within reaction chamber 104. Substrate 106 is shown resting on a bottom of vessel 102, but it is to be understood that there will typically be a holder (not shown) provided within vessel 102 to retain substrate 106. A pair of heating devices 108 and 110 are shown beneath a bottom of vessel 102, and another heating device 112 is shown at a top of vessel 102; additionally, or alternatively, a substrate holder can be provided which has a heater incorporated therein.

Heating devices 108 and 110 can be utilized to maintain substrate 106 at a desired temperature, and heating device 112 can be utilized to maintain the walls of vessel 102 at a desired temperature. Although two heating devices are shown at the bottom of the vessel, it is to be understood that in other aspects of the invention more than two heating devices could be provided, or less than two devices could be provided. Also, device 112 can be replaced with multiple devices in various aspects of the invention.

In operation, a metal complex of a catalyst (such as, for example, palladium(II) hexafluoroacetylacetonate), $H_2$, and at least one metal-containing precursor (such as, for example, copper(II) hexafluoroacetylacetonate) are provided within reaction chamber 104, and a supercritical fluid is formed within the reaction chamber. The supercritical fluid can comprise, consist essentially of, or consist of $CO_2$, for example. If the supercritical fluid comprises $CO_2$, a pressure within the reaction chamber will be greater than the critical pressure of carbon dioxide (72.8 atmospheres), and a temperature within the reaction chamber will be greater than the critical temperature of carbon dioxide (31° C.). In exemplary embodiments the temperature within the reaction chamber can be from greater than 31° C. to less than or equal to 125° C.

The catalyst forms activated hydrogen within the supercritical fluid, and the activated hydrogen is utilized to form metal from the metal-containing precursor. The metal then forms a layer across a surface of semiconductor substrate 106.

Exemplary reaction conditions can include a pressure of about 100 atmospheres within a carbon dioxide-containing supercritical fluid during formation of metallic copper from a copper-containing precursor. Hydrogen ($H_2$) can be provided within reaction chamber 104 to a pressure of from about 5 atmospheres to about 10 atmospheres, and the copper-containing precursor can be provided within the reaction chamber to a concentration that is from about $\frac{1}{30}$ fold stoichiometric relative to hydrogen to about $\frac{1}{20}$ fold stoichiometric relative to hydrogen. Further, the catalyst can be provided to less than about 3 weight percent relative to the copper-containing precursor.

The apparatus described with reference to FIG. 3 can be utilized by first charging reaction chamber 104 with appropriate reactants and then bringing the chamber contents to appropriate operating conditions to treat a single wafer. A different type of apparatus is described with reference to FIG. 4. The FIG. 4 apparatus allows flow-through of reactive materials, and also allows treatment of more than one wafer (or other substrates) at a time.

Specifically, FIG. 4 illustrates an apparatus 200 comprising a vessel 202 having a reaction chamber 204 defined therein. Vessel 202 also has an inlet port 220 and an outlet port 224 extending through sidewalls of the vessel. A heater 208 is shown at a bottom of the vessel, and another heater 210 is shown at a top of the vessel. Utilization of a single heater 208 at the bottom of the vessel, rather than the dual heaters shown at the bottom of vessel 100 of FIG. 3, is optional. Also, it is to be understood in either of the FIG. 3 or FIG. 4 constructions, multiple heaters could be arranged relative to the bottom, top, and even sides of the reaction chambers.

A pair of substrates 230 and 232 are illustrated within reaction chamber 204, and the substrates are shown held within a holder 234. If multiple wafers are to be treated in a batch, it can be preferred that the holder comprise a separate heater for each substrate so that the individual substrates can be efficiently heated.

In operation, a supercritical fluid is provided within chamber 204, and then various reactants are flowed through chamber 204. Specifically, the reactants are flowed into the chamber through inlet port 220, and out of the chamber through outlet port 224. Inlet port 220 can terminate in a showerhead (not shown) to enhance efficient dispersal of materials into the chamber.

Inlet port 220 is shown in fluid communication with a source 250. The source 250 can be a source of one or more of hydrogen, metal-containing precursor, and catalyst. Alternatively, multiple sources could be in fluid communication with inlet 220. Supercritical fluid can be flowed through the sources, and utilized to transport reactants from the sources into reaction chamber 204. The reactants can then form metal within chamber 204 which is deposited along surfaces of the substrates 230 and 232.

It is noted that the metal layers will be formed simultaneously on at least some exposed surfaces of both of the discrete substrates 230 and 232.

EXAMPLE

Copper Deposition by Hydrogen-Reduction in the Presence of Pd

A semiconductor wafer substrate having a silica dielectric layer was placed on the bottom of a deposition chamber. $Cu(hfa)_2$ (250 mg) and $Pd(hfa)_2$ (7 mg) were placed in the chamber, and the interior of the chamber was heated to 50° C. $H_2$ gas was introduced into the chamber to ten atmospheres, followed by 1500 psi of $CO_2$ at 50° C. The lower portion of the chamber was then heated to a temperature of between 85° C. and 120° C. Metallic copper was found to be deposited uniformly over the substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a semiconductor substrate having an upper surface comprising one or more of silicon, silicon nitride and borophosphosilicate glass;
   a first metal-containing layer over and in direct physical contact with the upper surface of the semiconductor substrate, the first metal-containing layer comprising one or both of tantalum and tungsten; and
   a second metal-containing layer over and in direct physical contact with the first metal-containing layer; the second metal-containing layer consisting essentially of a first metal and a second metal; the first metal being selected from the group consisting of copper, cobalt, nickel and mixtures thereof; and the second metal being selected from the group consisting of palladium, iridium, rhodium, ruthenium and mixtures thereof; the second metal-containing layer comprising at least 95 atom percent of the first metal and comprising from greater than 0 atom percent to less than 5 atom percent of the second metal.

2. The construction of claim 1 wherein the first metal of the second metal-containing layer consists essentially of copper.

3. The construction of claim 1 wherein the first metal of the second metal-containing layer consists essentially of cobalt.

4. The construction of claim 1 wherein the first metal of the second metal-containing layer consists essentially of nickel.

5. The construction of claim 1 wherein the second metal-containing layer comprises at least 97 atom percent of the first metal.

6. The construction of claim 1 wherein the second metal-containing layer comprises at least 99 atom percent of the first metal.

7. The construction of claim 1 wherein the second metal-containing layer comprises at least 97 atom percent copper.

8. The construction of claim 1 wherein the second metal-containing layer comprises at least 99 atom percent copper.

9. The construction of claim 1 wherein the second metal-containing layer consists essentially of copper and palladium.

10. The construction of claim 1 wherein the second metal-containing layer consists essentially of copper and iridium.

11. The construction of claim 1 wherein the second metal-containing layer consists essentially of copper and rhodium.

12. The construction of claim 1 wherein the second metal-containing layer consists essentially of copper and ruthenium.

13. The construction of claim 1 wherein the first metal-containing layer consists essentially of one or more of titanium silicide, tungsten nitride, titanium nitride and tantalum nitride.

14. The construction of claim 13 wherein the upper surface of the semiconductor substrate comprises silicon nitride.

15. The construction of claim 13 wherein the upper surface of the semiconductor substrate comprises borophosphosilicate glass.

16. The construction of claim 13 wherein the first metal-containing layer comprises titanium silicide.

17. The construction of claim 13 wherein the first metal-containing layer comprises tungsten nitride.

18. The construction of claim 13 wherein the first metal-containing layer comprises titanium nitride.

19. The construction of claim 13 wherein the first metal-containing layer comprises tantalum nitride.

* * * * *